United States Patent [19]
Wirth

[11] Patent Number: 6,146,489
[45] Date of Patent: Nov. 14, 2000

[54] METHOD AND APPARATUS FOR DEPOSITING SCINTILLATOR MATERIAL ON RADIATION IMAGER

[75] Inventor: Reinhold Franz Wirth, Ballston Spa, N.Y.

[73] Assignee: General Electric Company, Schenectady, N.Y.

[21] Appl. No.: 09/195,656

[22] Filed: Nov. 19, 1998

[51] Int. Cl.⁷ .............................. B32B 31/00; B05D 5/12; H01L 21/68
[52] U.S. Cl. ........................ 156/280; 156/279; 156/281; 118/504; 118/505; 427/75; 427/76; 427/282; 250/370.11
[58] Field of Search ............................... 156/90, 278, 279, 156/280, 281; 118/504, 505; 250/370.11; 427/5, 468, 75, 76, 282

[56] References Cited

U.S. PATENT DOCUMENTS 3,678,892  7/1972  Fairchild ................................. 118/504

FOREIGN PATENT DOCUMENTS

637084A1  2/1995  European Pat. Off. .
2758630  7/1998  France .

OTHER PUBLICATIONS

Patent Abstracts of Japan, 09297181, Nov. 18, 1997, Toshikazu.

European Search Report.

*Primary Examiner*—Curtis Mayes
*Attorney, Agent, or Firm*—Donald S. Ingraham; Douglas E. Stoner

[57] ABSTRACT

An apparatus to align the deposition of scintillator material on a radiation detector array includes a cover mask assembly configured to be positively positioned on a detector array and underlying pallet assembly to provide proper alignment of the mask with the array so that the active portion of the detector array may be coated with scintillator material without having the scintillator material on the adhesive and electrical contact portion of the detector array. An adhesive rim is disposed around the periphery of the active portion of the array and sized to provide the desired precise alignment of the mask over the detector array and form a seal with the array substrate and the pallet assembly to prevent migration of the scintillator material beyond the active area to be coated.

13 Claims, 2 Drawing Sheets

METHOD AND APPARATUS FOR DEPOSITING SCINTILLATOR MATERIAL ON RADIATION IMAGER

BACKGROUND OF THE INVENTION

This invention relates generally to solid state radiation imagers, and more particularly to depositing scintillator material on x-ray detector arrays.

Solid state radiation imaging devices typically include an array of photosensors coupled to a scintillator. Radiation incident on the scintillator is absorbed, resulting in the generation of optical photons which, in turn, are detected by the photosensor array to generate a corresponding electrical signal. A key factor in imager performance relates to the effective disposition and coupling of the scintillator to the photosensor array.

A typical scintillator material in radiation imaging arrays is Cesium Iodide (CsI). The cesium iodide is disposed over the detector array the active portion of the detector array, that is, the area in which incident X-ray beams are absorbed and detected. A cover plate typically is located over the array electrical contact portion to prevent x-ray beams from impinging on electrical conductors outside of the active area of the array. The cover plate typically is secured to the detector array by an adhesive applied between the array active portion and the electrical contact portion.

If the electrical conductors are coated with CsI, such coating can adversely affect image generation. Particularly, the electrical characteristics of the conductors could be impacted by the coating, and the signals obtained from the coated conductors may not accurately represent the characteristics of an attenuated x-ray beam which impinges on the array active portion. In addition, if CsI is applied to the area of the detector array to receive the adhesive, i.e., at the interface between the active portion and the electrical conductors, such CsI can affect the integrity of the bond between the adhesive and the detector array.

In an attempt to apply the CsI coating to only the active portion of the detector array, shadow masks typically are used. The shadow mask is intended to facilitate coating the entire array active portion with CsI while simultaneously preventing any migration of CsI into the inactive portion of the array, i.e., the portion of the array to receive the adhesive and the electrical contact portion.

Shadow masks typically are frame-like members with an inner periphery having substantially the same or slightly larger dimensions as the outer periphery of the array active portion. The frame member covers the array inactive portion.

Prior to coating the active portion of the detector, the shadow mask is positioned over the detector array so that an inner periphery of the frame member is substantially aligned with an outer periphery of the array active portion. The mask covers both the electrical contact portion and the area designated to receive the adhesive, i.e., the array inactive portion. The mask and detector array assembly is then located in an evaporator, and CsI is deposited on the assembly.

Systems presently used provide no positive registration positioning of the shadow mask on the array, and thus precise location of the mask is highly dependent upon the skill of the operator. Even when using the shadow mask, if the substrate is not precisely located, CsI may be deposited on the inactive portion of the detector array, e.g., the CsI may migrate into the inactive portion. Similarly, misalignment between the shadow mask and the array may result in a section of the detector array active portion not being coated with CsI, which also is undesirable.

It would be desirable to provide methods and apparatus for facilitating the deposition of CsI on only the active portion of a detector array and for preventing deposition of CsI on the array inactive portion. It also would be desirable for such methods and apparatus to be simple to implement and utilize.

BRIEF SUMMARY OF THE INVENTION

An apparatus for depositing scintillator material on a detector array includes a cover mask configured to be positively positioned (also referred to as registered) on a detector array to ensure proper alignment of the mask with the array so that an entire active portion of the detector array may be coated with the scintillator material without having any scintillator material on the adhesive and electrical contact portion of the detector array. In addition, an adhesive or epoxy rim on the array and between the array active portion and the electrical conductors substantially prevents migration of scintillator material from the active portion to the electrical conductors.

The cover mask includes a mask and a clamp frame that is adapted to be coupled to a pallet. The mask is substantially centered within the clamp frame and an inner periphery of the mask has substantially the same dimensions as the outer periphery of the detector array active portion. The clamp frame and mask have precise alignment openings extending therethrough, and the alignment openings substantially align with pins on a pallet. The pallet comprises a recess sized to match the dimensions of the active array and adhesive rim disposed on the substrate.

A method to deposit scintillator material on the detector array using a cover mask, the detector array including an active area, includes the steps of forming an adhesive rim on the detector array; positioning the mask over the detector array so that the adhesive rim is at least partially positioned within the mask; and depositing the scintillator material on the array.

DETAILED DESCRIPTION OF THE INVENTION

The present invention is described below in the context of an array panel for a solid state radiation imager (that is, the incident radiation is ultimately detected by solid state devices that generate an electrical signal representative of the radiation incident on the array). The present invention can be utilized in connection with detectors utilized in a variety of applications, such as x-ray signal detection for computed tomography, radiography, fluoroscopy, or the like, for use in medical, research, or industrial applications.

The generation of high resolution, low noise images necessitates that the detector panels used in solid state radiation imagers be efficient collectors of the incident energy. The detector panels thus are designed and fabricated to reduce to the extent appropriate potential sources of electrical noise that might be introduced in the detector panel itself or in connections between the panel and readout electronics. For this reason, the disposition of materials, such as scintillator material, over the detector array is critical to imager performance. Other components, such as a cover plate disposed over the detector panel, are similarly important to protect the panel and minimize external sources of electrical noise.

Figure 1:
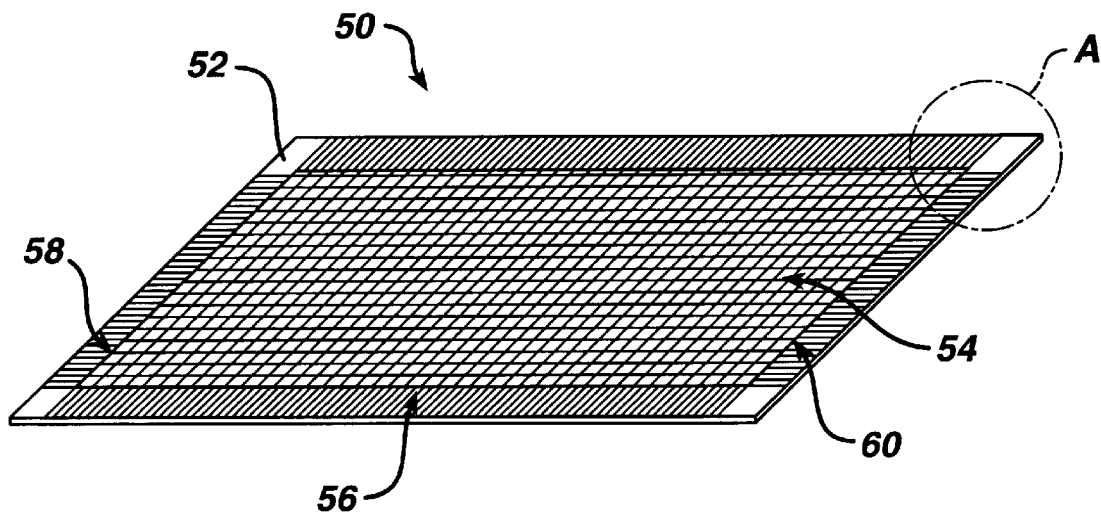
FIG. 1 is a perspective view of a detector array in one embodiment of the present invention.

In one embodiment of the present invention, a shadow mask is used to facilitate coating the entire active portion of a detector array without coating the array inactive portion, i.e., the adhesive and electrical contact portion of the detector array. As illustrated in FIG. 1, a detector panel 50 includes a substrate 52 providing a surface on which an active array portion 54 and an inactive portion 56 are disposed. Active array portion 54 includes a plurality of detector pixels used for generating electrical signals representative of a pattern of radiation incident on the detector. Commonly the active area of the detector panel comprises a matrix arrangement of photosensor pixels, with each pixel comprising a photosensor, such as a photodiode, and a respective switching element, to couple the pixel to readout electronics located off of the panel.

Inactive portion 56 on the detector panel 50 comprises a plurality of electrical conductors that provide the electrical connection between address lines coupled to the active portion of the array and control and readout electronics located off of the panel 50. Inactive portion 56 also includes a raised adhesive rim 58 which is disposed on detector array surface 52 so as to surround array active portion 54. More particularly, rim 58 extends from an interface 60 between active portion 54 and the electrical conductors, and thus serves to separate active portion 54 from the electrical conductors. Adhesive rim 58 is bonded to substrate surface 52 to provide a seal to prevent leakage or migration of scintillator material being deposited from the active area of the array to the inactive area of the array.

Adhesive rim 58 is typically formed with a bead of glue or epoxy applied to substrate surface 52. The bead of glue (or epoxy) commonly is applied with a computer controlled dispenser and planarized with a planarizing fixture and cured. The applied adhesive is typically shaped to have dimensions of about 10 mils (0.010 inches or 0.254 mm) in height (above the panel surface on which it is disposed), with a flattened (planarized) top surface, and a width in the range between about 120 mils and about 150 mils (0.012 inches (0.254 mm) to 0.15 inches (0.305). Rim 58 typically comprises a commercially available epoxy, such as Armstrong 661 type epoxy.

Figure 2:
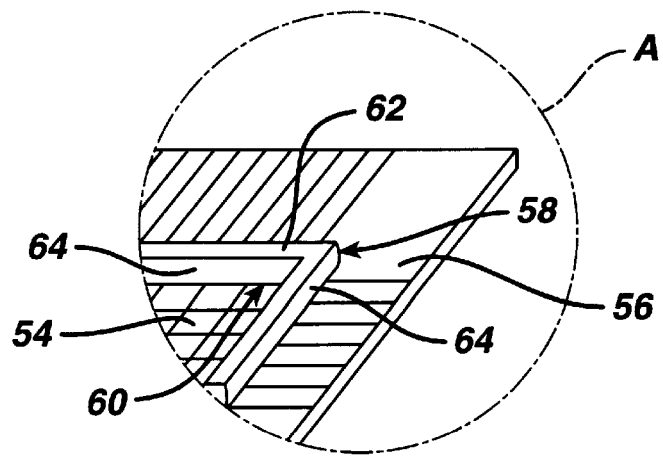
FIG. 2 is an enlarged view of the portion of the detector array which is circumscribed by circle A in FIG. 1.
Figure 3:
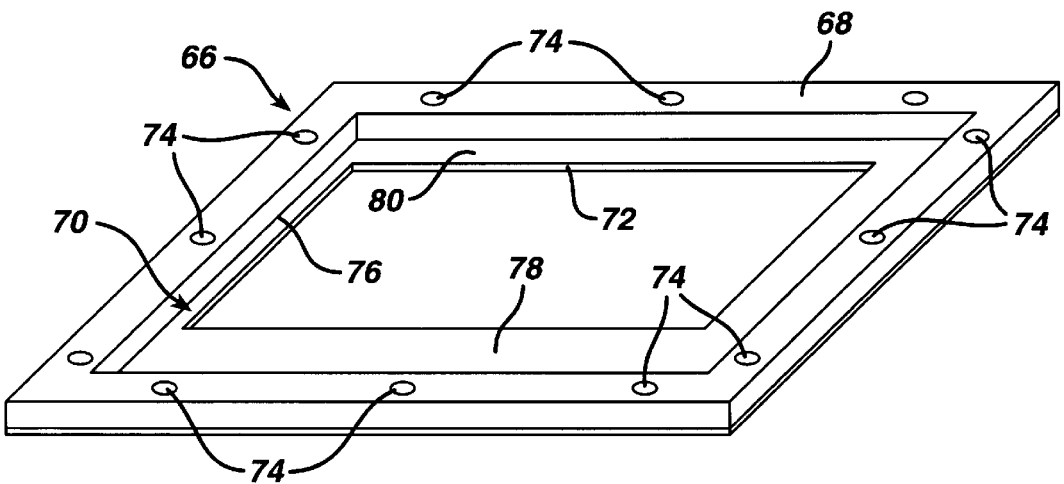
FIG. 3 is a perspective view of a clamp frame and shadow mask in accordance with one embodiment of the present invention.
Figure 4:
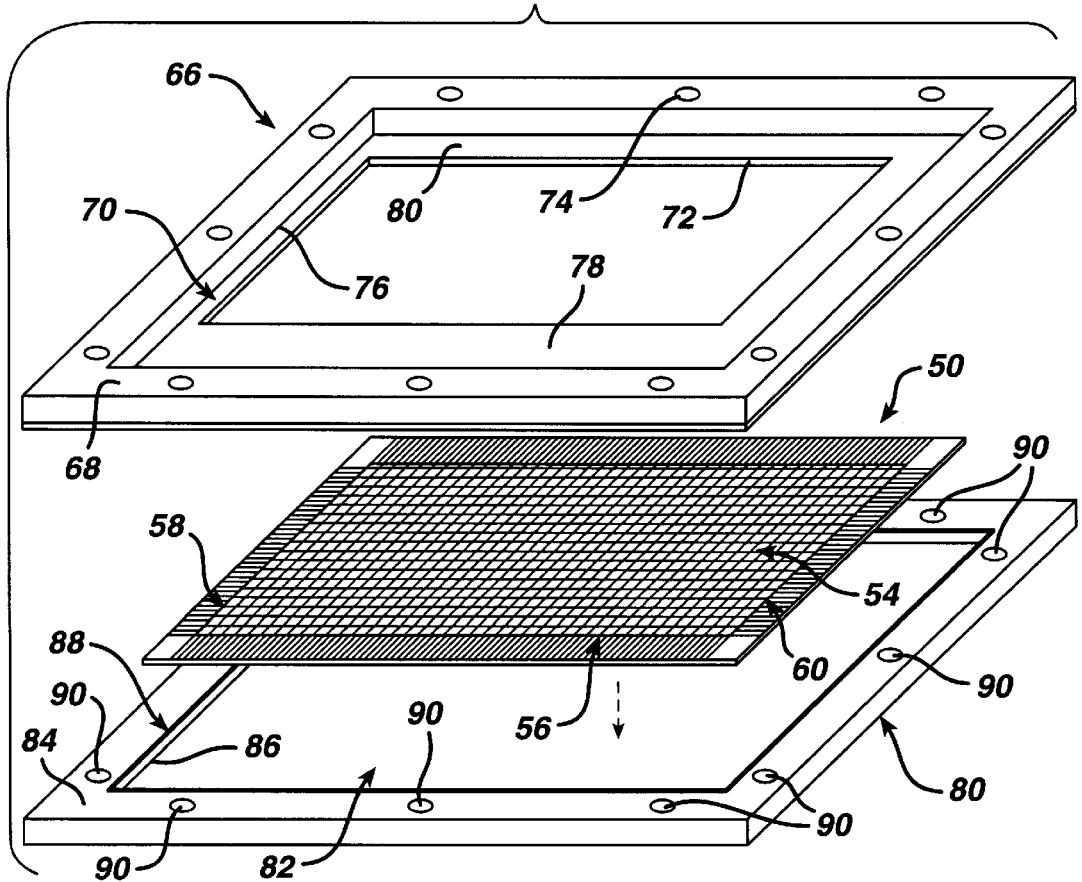
FIG. 4 is an exploded view of the detector array shown in FIG. 1 and the shadow mask with clamp frame shown in FIG. 3 aligned with a pallet.

FIG. 2 is an enlarged view of a portion of detector panel 50 outlined by circle A in FIG. 3. As shown in FIG. 4, glue rim 58 surrounds detector array active portion 54 and has a planar upper surface 62 (typically flat within plus or minus 0.001" (0.025 mm)). Rim 58 also includes substantially smooth side surfaces 64, that is the surfaces lack holes, bubbles, and other similar irregularities in surface texture.

As illustrated in FIG. 3, a clamp frame and mask 66 in accordance with one embodiment of the present invention includes a clamp frame 68 and a mask 70. Mask 70 is substantially centered within clamp frame 68 and an inner periphery 72 of plate 70 has substantially the same dimensions (that is, length and width) as the outer periphery of detector array active portion 54. Clamp frame 68 and mask 70 have precise alignment openings 74 extending therethrough, and alignment openings 74 substantially align with pins on a pallet as described below in more detail. Mask 70 typically is fabricated, for example, from aluminum, alloys coated with a nickel plating (e.g., iron-nickel-cobalt alloys referred to by the trade name of "Kovar"), or tetrafluroethylene (TFE, also known by the trade name Teflon). Frame 68 and plate 70 can be integral (that is, formed of one piece of material), or alternatively, fabricated separately and assembled together.

In preparation for deposition of scintillator material on detector array, mask 66 is aligned with detector array 50 so that mask plate inner periphery substantially aligns (that is, within about ±0.005" or 0.127 mm) with the outer periphery of array active portion 54 (e.g., as illustrated in FIG. 2). Glue rim 58 is at least partially located (that is within ±0.030" or 0.762 mm) within mask 70. Substrate 52 (with adhesive rim 58) disposed in the pallet pocket provides registration with mask and clamp frame assembly 66. This positive alignment facilitates ensuring that mask 70 covers detector inactive portion 56 while exposing the active portion 54 so that scintillator material is deposited only over the active portion and is not deposited on the inactive portion 56. . Detector array active portion 56 is not covered by mask 66.

Mask and clamp frame assembly 66 and detector array 50 are then secured to a carrier pallet 80. Particularly, carrier pallet 80 includes a pocket 82 which is sized so that when detector array 50 is positioned in pocket 82, detector array 50 is substantially flush (that is, about plus 0.003" (0.076 mm) and minus 0.00") with an upper surface 84 of carrier pallet 80. The pocket also provides accurate registration (e.g., within ±0.005" (0.127 mm)) of array within the pocket in correspondence with the line of the adhesive rim. A perimeter 86 of carrier pallet pocket 82 commonly is lined with a material 88 such as TFE (tradename of Teflon) to facilitate the CsI deposition by maintaining substrate position. Additionally, the flush fit between the pallet and the adhesive rim of the array provides a seal to prevent leakage of scintillator material being deposited on the active array to the inactive portion of the array. Pallet 80 also includes pins 90 which, when assembly 66 is aligned and positioned on pallet 80, extend through alignment openings 74 in assembly 66. Carrier pallet 80, assembly 66 and detector array 50 are then positioned in an evaporator and scintillator material (such as cesium iodide, selenium or the like is deposited on active portion 56.

Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A method for depositing CsI on a detector array utilizing a cover mask, the detector array including an active portion and an inactive portion, and a pallet device having a recess therein, the method comprising the steps of:

forming an adhesive rim on the detector array;

positioning the cover mask assembly over the detector array so that the adhesive rim is aligned within the mask through registration with the pallet device; and depositing scintillator material on the array.

2. A method in accordance with claim 1 wherein forming an adhesive rim on the detector array comprises the steps of applying a bead of adhesive to the array, shaping the rim, and curing the adhesive.

3. A method in accordance with claim 1 further comprising the step of securing the detector array and cover mask to said pallet device.

4. A method in accordance with claim 1 wherein said scintillator material consists of a material selected from the group consisting of cesium iodide and selenium.

5. An assembly for fabricating a solid state radiation detector comprising:

- a detector array having an active portion and an inactive portion;
- said array further comprising an adhesive rim disposed on said inactive portion of said array so as to surround said active portion of said array;
- a cover mask assembly having a structure corresponding to the dimensions of said inactive portion of said array, and
- a pallet assembly adapted to be coupled to said cover mask assembly and receive said array so that said array is aligned in said pallet in correspondence with said adhesive rim.

6. An assembly in accordance with claim 5 wherein said detector array active portion comprises a plurality of radiation detection pixels, and wherein said inactive portion comprises a plurality of electrical conductors electrically connected to respective pixels.

7. An assembly in accordance with claim 5 wherein said cover mask assembly comprises a clamp frame and a shadow mask, said mask being substantially centered within said clamp frame, an inner periphery of said mask having substantially the same dimensions as an outer periphery of said detector array active portion.

8. An assembly in accordance with claim 7 wherein said pallet assembly receives said array so as to accurately maintain the position said array in cooperation with said adhesive rim.

9. An assembly in accordance with claim 8 wherein said adhesive rim is at least partially located within said shadow mask.

10. An assembly in accordance with claim 8 wherein said the upper surface of said adhesive rim on said array is disposed to be substantially flush with an upper surface of said pallet assembly so as to form a seal to prevent leakage between said adhesive rim and said pallet assembly of scintillator material being deposited over said array.

11. An assembly in accordance with claim 5 wherein said pallet assembly comprises a plurality of alignment pins, and said cover mask comprises a plurality of alignment openings, said alignment pins extending into said alignment openings.

12. An assembly in accordance with claim 5 wherein said cover mask consists of a material selected from the group consisting of aluminum and metal alloy material.

13. An assembly in accordance with claim 5 wherein said adhesive rim is bonded to a substrate surface on which said array is disposed so as to provide a seal to prevent leakage between said adhesive rim and said substrate of scintillator material being deposited over said array.

* * * * *